United States Patent
Larson, III et al.

(10) Patent No.: US 6,927,651 B2
(45) Date of Patent: Aug. 9, 2005

(54) ACOUSTIC RESONATOR DEVICES HAVING MULTIPLE RESONANT FREQUENCIES AND METHODS OF MAKING THE SAME

(75) Inventors: John D. Larson, III, Palo Alto, CA (US); Yury Oshmyansky, Camarillo, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/436,404

(22) Filed: May 12, 2003

(65) Prior Publication Data
US 2004/0227590 A1 Nov. 18, 2004

(51) Int. Cl.[7] .............................................. H03H 9/58
(52) U.S. Cl. ........................ 333/189; 333/187; 310/366
(58) Field of Search .............................. 333/187, 189, 333/197, 320; 310/330, 321, 359, 366

(56) References Cited

U.S. PATENT DOCUMENTS

| | | | |
|---|---|---|---|
| 3,590,287 A | * 6/1971 | Berlincourt et al. | ........ 310/321 |
| 5,118,982 A | 6/1992 | Inoue et al. | |
| 5,910,756 A | 6/1999 | Ella | |
| 5,935,641 A | * 8/1999 | Beam et al. | ................ 427/100 |
| 5,936,486 A | 8/1999 | Tanaka | |
| 6,242,843 B1 | 6/2001 | Pohjonen et al. | |
| 6,452,310 B1 | * 9/2002 | Panasik | ...................... 310/334 |
| 6,472,959 B1 | 10/2002 | Beaudin et al. | |
| 6,563,400 B2 | * 5/2003 | Itasaka et al. | ............... 333/187 |
| 2002/0089395 A1 | 7/2002 | Ella et al. | |
| 2002/0175781 A1 | 11/2002 | Wunnicke et al. | |
| 2005/0012568 A1 | * 1/2005 | Aigner et al. | ................ 333/187 |

FOREIGN PATENT DOCUMENTS

| | | | |
|---|---|---|---|
| DE | 10149542 | * | 4/2003 |
| JP | 11136075 | * | 5/1999 |

OTHER PUBLICATIONS

M.J. Murphy et al., "Normal and Inverted AlGaN/GaN Based Piezoelectric Field Effect Transistors Grown by Plasma Induced Molecular Beam Epitaxy," MRS Internet J. Nitride Semicond. Res. 4 Si, G8.4 (1999).

* cited by examiner

Primary Examiner—Dinh T. Le

(57) ABSTRACT

Acoustic resonator devices having multiple resonant frequencies and methods of making the same are described. In one aspect, an acoustic resonator device includes an acoustic resonant structure that includes first and second electrodes and first and second piezoelectric layers. The first and second electrodes abut opposite sides of a resonant volume free of any interposing electrodes. The first and second piezoelectric layers are disposed for acoustic vibrations in the resonant volume and have different respective acoustical resonance characteristics and respective piezoelectric axes oriented in different directions. The acoustic resonant structure has resonant electric responses at first and second resonant frequencies respectively determined at least in part by the acoustical resonance characteristics of the first and second piezoelectric layers.

27 Claims, 2 Drawing Sheets

ACOUSTIC RESONATOR DEVICES HAVING MULTIPLE RESONANT FREQUENCIES AND METHODS OF MAKING THE SAME

BACKGROUND

Many different acoustic resonator devices have been developed. Known Bulk Acoustic Wave (BAW) resonators include a single piezoelectric layer disposed between two electrodes. Monolithic BAW resonators commonly are referred to as Thin Film Bulk Acoustic Wave Resonators (FBARs). Stacked Crystal Filters (SCFs) devices typically include two piezoelectric layers disposed between top and bottom electrode layers and separated from each other by a middle electrode, which typically is used as a grounding electrode.

A BAW resonator has a resonant frequency that is determined primarily by the thickness of the piezoelectric layer and secondarily by the thicknesses and the materials used for other the layers. A BAW resonator typically is acoustically isolated from the supporting substrate by an isolation structure, such as a cavity formed under a membrane supporting a BAW resonator (see, e.g., U.S. Pat. No. 5,873,253) or an acoustic mirror consisting of a stack of layers alternately formed of high and low acoustic impedance materials and having respective thicknesses of approximately one-quarter of the target resonant frequency of the device (see, e.g., K. M. Lakin, G. R. Kline, K. J. McKarron, "Development of Minature Filters for Wireless Applications," IEEE Microwave Theory & Techniques Symposium Digest, pp. 883–886, (1995)).

BAW resonators often are used as components of a radiofrequency (RF) filter that may be used in, for example, mobile telephones. A common RF ladder filter, for example, includes a series BAW resonator connected in series with the signal to be filtered and a shunt BAW resonator connected in parallel to shunt the signal to be filtered. Some RF ladder filters include a series combination of multiple pairs of series and shunt BAW resonators. The resonant frequencies of the resonators of a series and shunt resonator pair are shifted slightly with respect to each other to form a passband characterized by a center frequency (i.e., a frequency midway between passband edges corresponding to the series resonance frequency of the series resonator and the parallel resonant frequency of the shunt resonator) (see, e.g., R. C. Ruby, P. Bradley, Y. Oshmyansky, A. Chien, J. D. Larson III, "Thin Film Bulk Acoustic Resonators (FBAR) for Wireless Applications," 2001 IEEE Ultrasonics Symposium, Atlanta, Ga., Oct. 8–10, 2001, paper 3E-3, pp. 813–821).

SUMMARY

The invention features acoustic resonator devices having multiple resonant frequencies and methods of making the same. The invention enables a multi-band filter to be implemented with 1/N (where N is the number of bands) times the number of acoustic resonator devices as similar multi-band filters implemented with single-frequency acoustic resonator devices. This allows the size of such filters to be reduced significantly.

In one aspect, the invention features an acoustic resonator device that includes an acoustic resonant structure that includes first and second electrodes and first and second piezoelectric layers. The first and second electrodes abut opposite sides of a resonant volume free of any interposing electrodes. The first and second piezoelectric layers are disposed for acoustic vibrations in the resonant volume and have different respective acoustic resonance characteristics and respective piezoelectric axes oriented in different directions. The acoustic resonant structure has resonant electric responses at first and second resonant frequencies respectively determined at least in part by the acoustic resonance characteristics of the first and second piezoelectric layers.

In another aspect, the invention features a method of making an acoustic resonator device, in accordance with which a first electrode is formed over an acoustic isolation structure. A first piezoelectric layer is formed over the first electrode. A second piezoelectric layer is formed over the first piezoelectric layer without any interposing electrodes. The first and second piezoelectric layers have different respective acoustic resonance characteristics and respective piezoelectric axes oriented in different directions. A second electrode is formed over the second piezoelectric layer.

In another aspect, the invention features a method of making a device (e.g., an acoustic resonant device). In accordance with this inventive method, a first piezoelectric layer having a first piezoelectric axis oriented in a first direction is deposited. A seed layer is deposited on the first piezoelectric layer. A second piezoelectric layer having a second piezoelectric axis oriented in a second direction different from the first direction is deposited on the seed layer.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
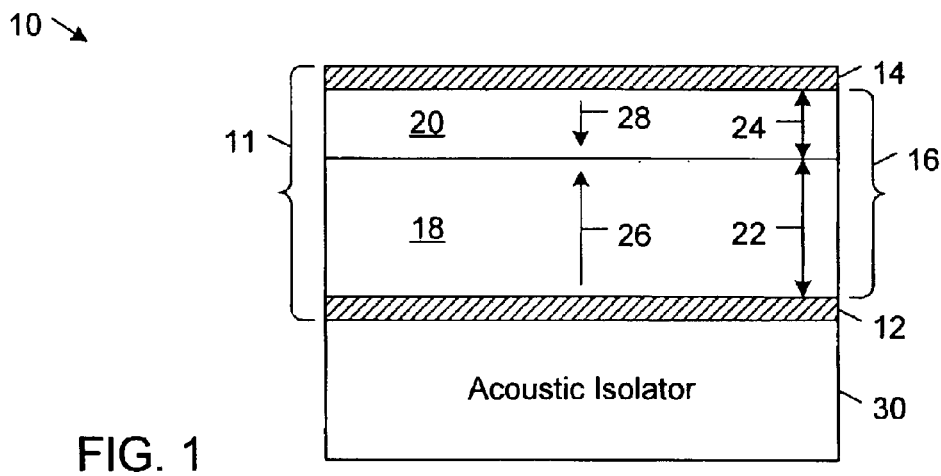
FIG. 1 is a diagrammatic side view of an acoustic resonant device that includes an acoustic resonant structure formed on an acoustic isolator.

FIG. 1 shows an embodiment of an acoustic resonator device 10 that has an acoustic resonant structure 11 that includes first and second electrodes 12, 14 abutting opposite sides of a resonant volume 16 that is free of any interposing electrodes. As used herein, the term "electrode" refers to an electrical conductor incorporated within the acoustic resonator device 10 and designed to be electrically connected to another electric device, an active or passive circuit element, or a source of positive, negative or ground electric potential but excludes electrical conductors not configured for electrical connection. First and second piezoelectric layers 18, 20 are disposed for acoustic vibrations in the resonant volume 16 and have different respective acoustic resonance characteristics. In the illustrated embodiment, first and second piezoelectric layers 18, 20 have different respective thicknesses 22, 24. In this embodiment, first and second piezoelectric layers 18, 20 may be formed from the same or different piezoelectric materials so long as first and second piezoelectric layers have different respective acoustic resonance characteristics. In other embodiments, first and second piezoelectric layers 18, 20 have the same thicknesses but are formed of different piezoelectric materials so that they have different respective acoustic resonance characteristics.

First and second piezoelectric layers 18, 20 have respective piezoelectric axes 26, 28 oriented in different directions. In the example shown in FIG. 1, the piezoelectric axes 26, 28 of the first and second piezoelectric layers 18, 20 are oriented in opposite directions that are perpendicular to the plane of the first electrode 12. In general, piezoelectric axes 26, 28 may be oriented in any respective directions so long as they are different, although not all directions are well-coupled piezoelectrically because the intrinsic coupling constant ($k_T^2$) varies with the orientation of the piezoelectric axis (see, e.g., N. F. Foster, G. A. Rozgonyi, and F. A. Vannatta, IEEE Trans. Sonics & Ultrasonics, SU-15, pp. 28–41, 1968).

The acoustic resonant structure 11 is formed on an acoustic isolator 30. The acoustic isolator 30 may be, for example, a membrane formed over a cavity of a supporting substrate. Acoustic isolator 30 acoustically isolates the acoustic resonant structure 11 from the supporting substrate.

Figure 2:
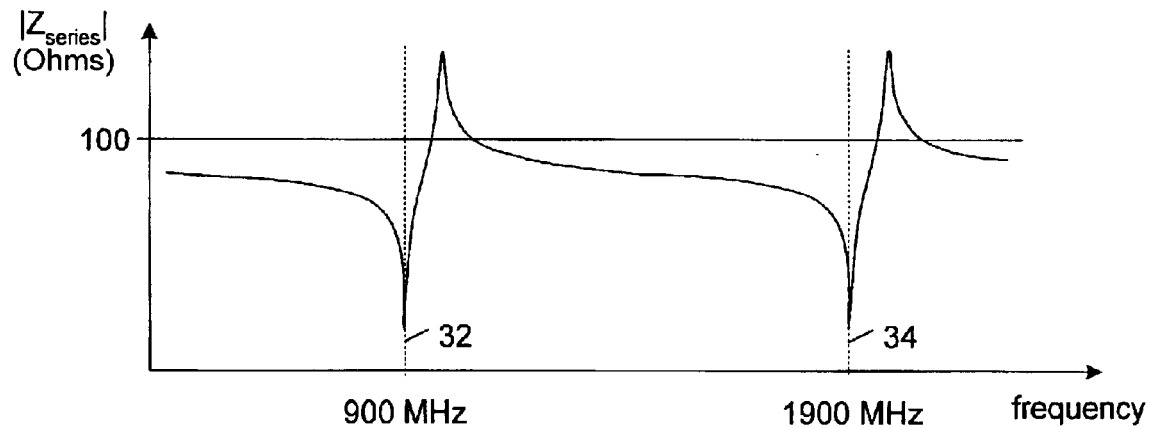
FIG. 2 is a graph of a diagrammatic electric response of the acoustic resonant device of FIG. 1.

Referring to FIG. 2, in operation, the acoustic resonant structure 11 has resonant electrical responses at first and second resonant frequencies 32, 34, which are determined at least in part by the acoustical resonance characteristics of the first and second piezoelectric layers 18, 20. For example, in the embodiment of FIG. 1, the difference between resonant frequencies 32, 34 is largely determined by the relative thicknesses of piezoelectric layers 18, 20 and the magnitudes of resonant frequencies 32, 34 are largely determined by the combined thickness of piezoelectric layers 18, 20. The thicknesses of first and second electrodes 12, 14 and the material compositions of the first and second electrodes 12, 14 and the first and second piezoelectric layers 18, 20 also affect the values of resonant frequencies 32, 34. In the exemplary electrical response shown in FIG. 2, the first and second resonant frequencies are 900 MHz and 1900 MHz, which respectively correspond to the series impedance ($Z_{series}$) passband edges of the AMPS (Advanced Mobile Phone Services) and PCS (Personal Communications Services) mobile telephone operating frequency bands.

Figure 3:
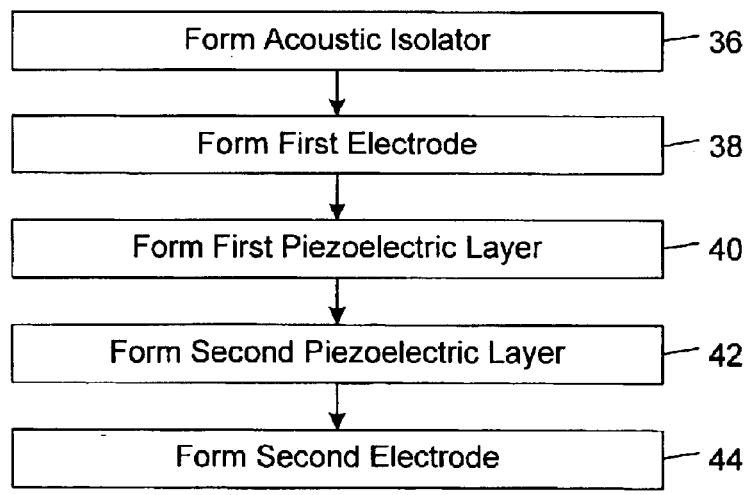
FIG. 3 is a flow diagram of a method of making the acoustic resonant device of FIG. 1.

FIG. 3 shows an embodiment of a method of making acoustic resonant device 10. Acoustic isolator 30 is formed in or on a substrate (step 36). Acoustic isolator 30 may be, for example, a membrane formed over a cavity in the substrate. First electrode 12 is formed over acoustic isolator 30 (step 38). First electrode 12 is formed of an electrically-conducting material (e.g., gold, molybdenum, or aluminum). In the description provided below, orientations of the piezoelectric axes are defined with respect to the "plane" of the first electrode 12, which is defined herein as a plane roughly corresponding to a top surface of first electrode 12 that is substantially perpendicular to the stacking or growth direction of the layers of acoustic resonant structure 11.

First piezoelectric layer 18 is formed over first electrode 12 (step 40). First piezoelectric layer 18 is formed of any piezoelectric material that is characterized by a piezoelectric axis 26 that is oriented in a non-parallel direction with respect to the plane of the first electrode 12. For example, first piezoelectric layer 18 may be formed of a wurtzite-type hexagonal crystal, in which case the piezoelectric axis (referred to as the "c-axis") is oriented perpendicularly with respect to the plane of the first electrode 12. Exemplary wurtzite-type hexagonal crystals include cadmium sulfide, cadmium selenide, zinc oxide, beryllium oxide, aluminum nitride, and wurtzite zinc sulfide, and solid solutions thereof. First piezoelectric layer 18 also may be formed of a non-wurtzite-type hexagonal crystal piezoelectric material, such as a sphalerite cubic crystal, in which case the piezoelectric axis 26 may or may not be oriented perpendicularly with respect to the plane of the first electrode 12.

Second piezoelectric layer 20 is formed over first piezoelectric layer 18 (step 42). Second piezoelectric layer 20 is formed of any piezoelectric material that is characterized by a piezoelectric axis 28 that is oriented in a direction that is different from the orientation direction of the piezoelectric axis 26 of first piezoelectric layer 18 and is non-parallel with respect to the plane of the first electrode 12. For example, second piezoelectric layer 20 may be formed of a wurtzite-type hexagonal crystal, in which case the piezoelectric axis is perpendicular to the plane of the first electrode 12. Exemplary wurtzite-type hexagonal crystals include cadmium sulfide, cadmium selenide, zinc oxide, beryllium oxide, aluminum nitride, and wurtzite zinc sulfide, and solid solutions thereof. Second piezoelectric layer 20 also may be formed of a non-wurtzite-type hexagonal crystal piezoelectric material, such as a sphalerite cubic crystal, in which case the piezoelectric axis 28 may or may not be oriented perpendicularly with respect to the plane of the first electrode 12.

Second electrode 14 is formed over the second piezoelectric layer 20 (step 44). Second electrode 14 is formed of an electrically-conducting material (e.g., gold, molybdenum, or aluminum).

In one exemplary implementation, each of the first and second electrodes 12, 14 is a molybdenum layer with a thickness of about 0.225 µm (micrometers). First piezoelectric layer 18 is an aluminum nitride layer with a thickness of about 3.105 µm and a piezoelectric axis (or c-axis) oriented in a direction that is perpendicular to the plane of the first electrode 12. Second piezoelectric layer 20 is an aluminum nitride layer with a thickness of about 1.295 µm and a piezoelectric axis (or c-axis) oriented in a direction that is perpendicular to the plane of the first electrode 12 and is opposite the orientation direction of the piezoelectric axis 26 of first piezoelectric layer 18.

In some embodiments, first and second piezoelectric layers 18, 20 are formed by forming first piezoelectric layer 18 in a deposition chamber under a first set of growth conditions, and then forming second piezoelectric layer 20 under a different set of growth conditions or on an interposed seed layer that sets the piezoelectric axis 28 to a different orientation than piezoelectric axis 26. As used herein, the term "seed layer" refers to a layer that provides a surface that sets the piezoelectric axis of the second piezoelectric layer to a different orientation than the orientation of the piezoelectric axis of the first piezoelectric layer. In some implementations, the seed layer is an electrically-conductive layer, but no electrical connections are made to such a seed layer so that it constitutes a non-electrode layer and that the resonant volume in which such a seed layer is located is free of interposing electrodes. In some implementations, the second piezoelectric layer is formed directly on the first piezoelectric layer with a piezoelectric axis that is oriented in a different direction than the orientation of the piezoelectric axis of the first piezoelectric layer.

In one example, first piezoelectric layer 18 is formed by sputtering an aluminum target with a power level of 7 kW (kilowatts), at a pressure of $3.105 \times 10^{-3}$ torr, with an atmosphere of about 20% argon and about 80% nitrogen. A non-electrode seed layer of aluminum oxynitride is formed over the first piezoelectric layer 18 by sputtering the aluminum target with a lower power level (e.g., 1 kW), at a pressure of $3.105 \times 10^{-3}$ torr, with an atmosphere of about 20% argon, about 80% nitrogen, and small percentage (e.g., about 0.5%) of oxygen. The aluminum oxynitride seed layer may have a thickness on the order of about 30 nm. Second piezoelectric layer 20 then is formed by sputtering the aluminum target with a power level of 7 kW, at a pressure of $3.105 \times 10^{-3}$ torr, with an atmosphere of about 20% argon and about 80% nitrogen. It is believed that the aluminum oxynitride seed layer reverses the stacking order of the constituent elements of the second piezoelectric layer 20 relative to the stacking order of the constituent elements of the first piezoelectric layer 18 and, thereby, allows the direction of piezoelectric axis 26 to be reversed relative to the direction of piezoelectric axis 28.

Figure 4:
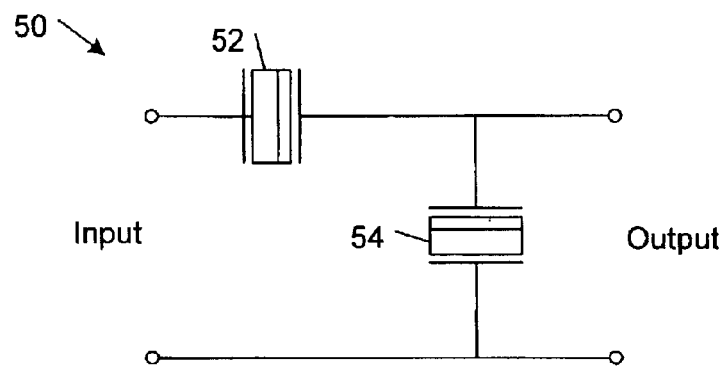
FIG. 4 is a circuit diagram of a pair of series and shunt acoustic resonant devices of a ladder filter.

FIG. 4 shows an embodiment of an acoustic resonator device 50 that includes a series acoustic resonator 52 and a shunt acoustic resonator 54 connected to form a ladder filter. Each of the resonators 52, 54 corresponds to acoustic resonant device 10 and has respective resonant electric responses at first and second resonant frequencies. The first and second resonant responses of the series acoustic resonator 52 are frequency-shifted with respect to the first and second resonant frequencies of the shunt acoustic resonator 54, respectively.

Figure 5:
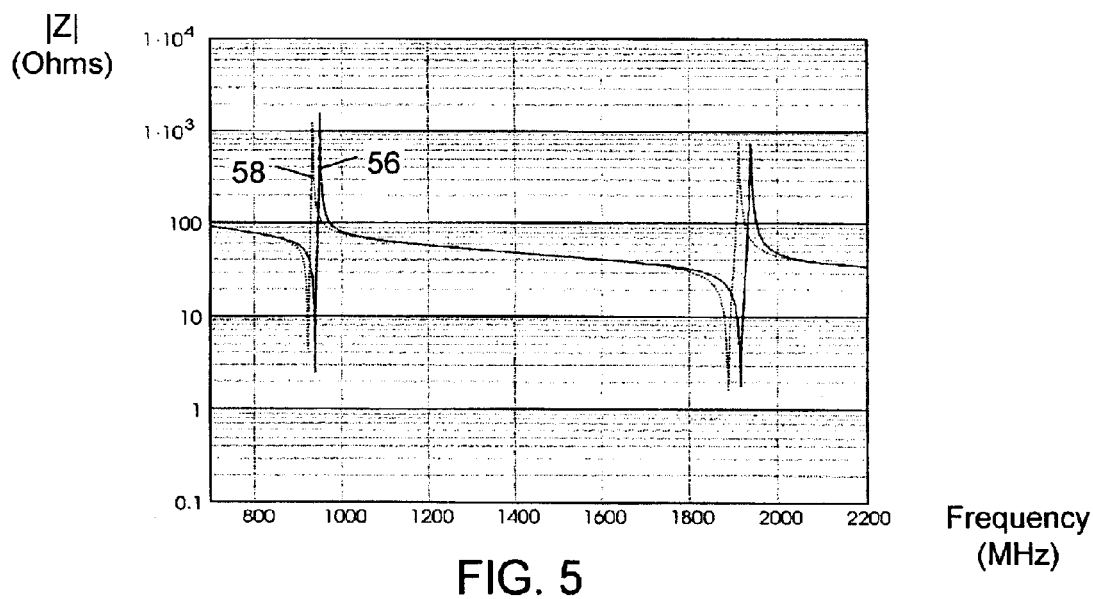
FIG. 5 is a graph of examples of computed individual electric responses of the series and shunt acoustic resonant devices of FIG. 4.

FIG. 5 shows an example of computed electric responses 56, 58 for series and shunt acoustic resonators 52, 54, respectively. In this example, the first and second piezoelectric layers of each of the series and shunt acoustic resonators 52, 54 are assumed to be formed of aluminum nitride with respective thicknesses of 3.105 μm and 1.295 μm. The intrinsic coupling constants ($k_1^2$) of the first and second piezoelectric layers for each of the series and shunt acoustic resonators 52, 54 are assumed to be 6.5% and 4% respectively. The electrodes of the series and shunt acoustic resonators 52, 54 are assumed to be formed of molybdenum and have respective thicknesses of 0.225 μm. The area (in a plane normal to the stacking or growth direction) of each of the series and shunt acoustic resonators 52, 54 is assumed to be 102,400 μm². Various computed parameters for each of the series and shunt acoustic resonators 52, 54 are presented in TABLE 1 below.

TABLE 1

| PARAMETER | FIRST RESONANT RESPONSE | SECOND RESONANT RESPONSE |
|---|---|---|
| Series Resonant Frequency | 938 MHz | 1913 MHz |
| Series Input Impedance | 2.5 Ohms | 1.8 Ohms |
| Parallel Resonant Frequency | 949 MHz | 1936 MHz |
| Parallel Input Impedance | 1554 Ohms | 715 Ohms |
| Resonant Impedance ($X_{o1}$) | 76 Ohms | 40 Ohms |

TABLE 1-continued

| PARAMETER | FIRST RESONANT RESPONSE | SECOND RESONANT RESPONSE |
|---|---|---|
| Effective Coupling Constant ($k_{1,effective}^2$) | 2.7% | 2.9% |
| Temperature Coefficient | −26.7 ppm/° C. | −25.8 ppm/° C. |

Figure 6:
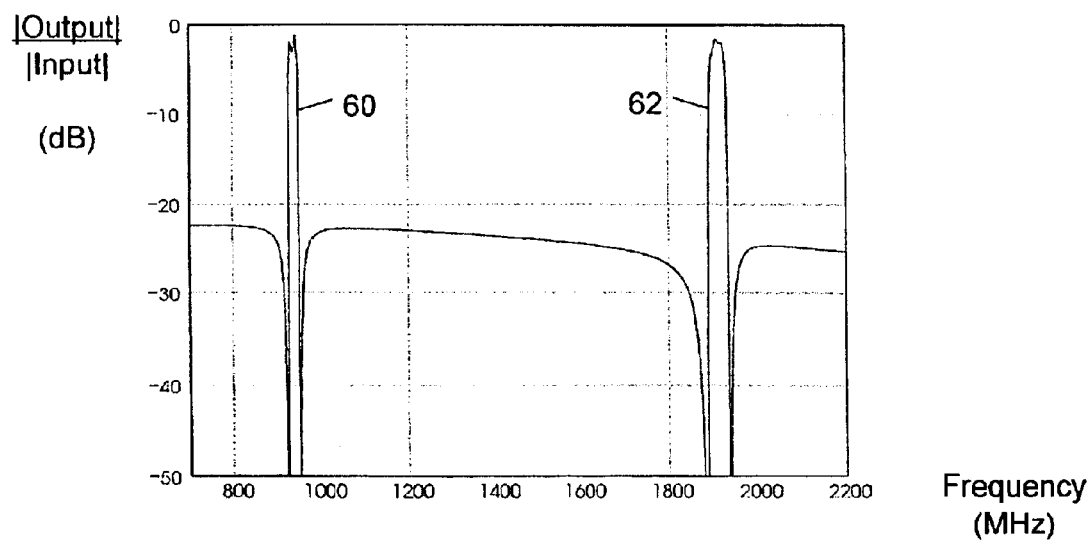
FIG. 6 is a graph of an example of a computed electric response of a ladder filter formed from three series and four shunt acoustic resonant devices.

FIG. 6 shows an example of a computed transfer function (|Output|/|Input|) for a ladder filter formed from three series acoustic resonators and four shunt acoustic resonators having the same corresponding parameter values of the series and shunt acoustic resonators in the example described above in connection with FIG. 5. The input and output of the ladder filter are assumed to be connected to respective 50 Ohm shunts. The electric response of this exemplary ladder filter has passbands 60, 62 with normal center frequencies at 900 MHz and 1900 MHz, respectively. Ladder filters of this type may be incorporated, for example, into telecommunications receivers and transmitters to provide dual-mode mobile telephone devices.

Other embodiments are within the scope of the claims.

What is claimed is:

1. An acoustic resonator device, comprising:
   an acoustic resonant structure including
   first and second electrodes abutting opposite sides of a resonant volume free of any interposing electrodes, and
   first and second piezoelectric layers disposed for acoustic vibrations in the resonant volume and having different respective acoustical resonance characteristics and respective piezoelectric axes oriented in different directions;
   wherein the acoustic resonant structure has resonant electric responses at first and second resonant frequencies respectively determined at least in part by the acoustical resonance characteristics of the first and second piezoelectric layers.

2. The device of claim 1, wherein the first and second piezoelectric layers have different respective thicknesses.

3. The device of claim 1, wherein the piezoelectric axes of the first and second piezoelectric layers are oriented in opposite directions.

4. The device of claim 3, wherein the piezoelectric axes of the first and second piezoelectric layers are perpendicular to the first and second electrodes.

5. The device of claim 1, wherein the first and second piezoelectric layers are formed of different materials.

6. The device of claim 1, wherein each of the first and second piezoelectric layers is a wurtzite-type hexagonal crystal layer.

7. The device of claim 6, wherein each of the first and second piezoelectric layers is formed of a material selected from aluminum nitride and zinc oxide.

8. The device of claim 1, wherein the acoustic resonant structure is a thin film bulk acoustic wave resonator.

9. The device of claim 1, wherein the acoustic resonant structure includes a seed layer disposed between the first and second piezoelectric layers.

10. The device of claim 9, wherein the first piezoelectric layer is formed of elements in a first set, the second piezoelectric layer is formed of elements in a second set, and the seed layer is formed of elements in a third set including one or more of the elements in a union of the first and second sets.

11. The device of claim 10, wherein each of the first and second piezoelectric layers is formed of aluminum nitride and the seed layer is formed of aluminum oxynitride.

12. The device of claim 1, wherein the first and second resonant frequencies of the acoustic resonant structure substantially correspond to 900 MHz and 1900 MHz, respectively.

13. The device of claim 1, further comprising a second acoustic resonant structure coupled to the first acoustic resonant structure and including third and fourth electrodes abutting a resonant volume free of any interposing electrodes, and third and fourth piezoelectric layers disposed for acoustic vibrations in the resonant volume and having different respective acoustical resonance characteristics and respective piezoelectric axes oriented in different directions, wherein the second acoustic resonant structure has resonant electric responses at third and fourth resonant frequencies respectively determined at least in part by the acoustical resonance characteristics of the third and fourth piezoelectric layers.

14. The device of claim 13, wherein the first and second resonant frequencies of the first acoustic resonant structure are frequency-shifted relative to the third and fourth resonant frequencies of the second acoustic resonant structure, respectively.

15. The device of claim 12, wherein the first and second acoustic resonant structures are connected respectively as series and shunt resonators of a ladder filter having an electric response characterized by first and second passbands with different center frequencies.

16. A method of making an acoustic resonator device, comprising:

forming a first electrode over an acoustic isolation structure;

forming a first piezoelectric layer over the first electrode;

forming a second piezoelectric layer over the first piezoelectric layer without any interposing electrodes, wherein the first and second piezoelectric layers have different respective acoustical resonance characteristics and respective piezoelectric axes oriented in different directions; and forming a second electrode over the second piezoelectric layer.

17. The method of claim 16, wherein the first and second piezoelectric layers have different respective thicknesses.

18. The method of claim 16, wherein the first and second piezoelectric layers are formed of different materials.

19. The method of claim 16, wherein each of the first and second piezoelectric layers is formed of a wurtzite-type hexagonal crystal.

20. The method of claim 19, wherein each of the first and second piezoelectric layers is formed of a material selected from aluminum nitride and zinc oxide.

21. The method of claim 16, wherein the acoustic resonant structure is a thin film bulk acoustic wave resonator.

22. The method of claim 16, further comprising forming a seed layer between the first and second piezoelectric layers.

23. The method of claim 22, wherein the first piezoelectric layer is formed of elements in a first set, the second piezoelectric layer is formed of elements in a second set, and the seed layer is formed of elements in a third set including one or more of the elements in a union of the first and second sets.

24. The method of claim 23, wherein each of the first and second piezoelectric layers is formed of aluminum nitride and the seed layer is formed of aluminum oxynitride.

25. A method of making a device, comprising:

depositing a first piezoelectric layer having a first piezoelectric axis oriented in a first direction;

depositing a seed layer on the first piezoelectric layer; and depositing on the seed layer a second piezoelectric layer having a second piezoelectric axis oriented in a second direction different from the first direction.

26. The method of claim 25, wherein the first piezoelectric layer is formed of elements in a first set, the second piezoelectric layer is formed of elements in a second set, and the seed layer is formed of elements in a third set including one or more of the elements in a union of the first and second sets.

27. The method of claim 26, wherein each of the first and second piezoelectric layers is formed of aluminum nitride and the seed layer is formed of aluminum oxynitride.

* * * * *